(12) United States Patent
Wagaman et al.

(10) Patent No.: US 6,342,572 B1
(45) Date of Patent: Jan. 29, 2002

(54) FLAME RETARDANT BENZOCYCLOBUTENE RESIN WITH REDUCED BRITTLENESS

(75) Inventors: Michael W. Wagaman, Florham Park, NJ (US); Thomas F. McCarthy, Bennington, VT (US)

(73) Assignee: Honeywell International Inc., Morris Township, NJ (US)

( * ) Notice: Subject to any disclaimer, the term of this patent is extended or adjusted under 35 U.S.C. 154(b) by 0 days.

(21) Appl. No.: 09/473,720

(22) Filed: Dec. 28, 1999

(51) Int. Cl.$^7$ .................................................. C08F 32/00
(52) U.S. Cl. ..................... 526/308; 428/365; 428/375; 428/376; 428/378; 526/309; 570/125; 570/126; 570/127; 570/128; 570/129; 570/131; 570/132
(58) Field of Search ............................. 526/308, 309; 524/494; 428/364, 365, 375, 376, 378; 570/125, 126, 127, 128, 129, 131, 132

(56) References Cited

U.S. PATENT DOCUMENTS 4,128,709 A   12/1978   Vollkommer et al. ........ 526/218

FOREIGN PATENT DOCUMENTS

| | | |
|---|---|---|
| EP | 0 334 269 | 9/1989 |
| EP | 0 400 749 | 12/1990 |
| EP | 92306827.4 | 2/1993 |
| WO | WO 86/01809 | 3/1986 |

OTHER PUBLICATIONS

Hahn, et al., "Thermal Polymerization of Bis(benzocyclobutene) Monomers Containing Disubstituted Ethenes" dated Jul. 1993, pp. 3870–3877.

Marks, et al.; "Preparation, analysis and properties of benzocyclobutene–terminated polycarbonate–polycarbonate thermoplastic alloys" *J.Appl.Polym.Sci* ,1997, 66, 1821.

Martin, et al; "Flame resistance of bnzocyclobutene (BCB) functionalized copolymers". Annu. Tech. Conf.–Soc. Plast. Eng. 1996, 54, 3008.

Kirchhohh, R.A., et al "Polymers from Benzocyclobutenes"; Adv. Polym. Sci. (1994) 117; High Performance Polymers.

*Primary Examiner*—Edward J. Cain
(74) *Attorney, Agent, or Firm*—Curtis B. Brueske

(57) ABSTRACT

The invention pertains to benzocyclobutene resins having flame retardant properties. Such resins have a high glass transition temperature (Tg>250° C.), low moisture absorption, low dielectric constant, good mechanical properties, flame retardancy (meets or exceeds UL94 V-O and/or VTM-O requirements), and can be cast onto a reinforcement to prepare a laminate for use as a substrate for electronic circuitry. The flame resistant compound is reaction product of a halogen containing compound of the formulae

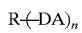

or

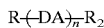

wherein R is a halogen containing aromatic group, a halogen containing aliphatic group or a combination thereof; $R_2$ is hydrogen, an aromatic group, an aliphatic group or an combination of an aromatic group and an aliphatic group which may contain halogen atoms; DA is a Diels-Alder reactive diene or a group that can act as a dienophile in a Diels-Alder reaction; and n is greater than or equal to 1; with a benzocyclobutene compound.

20 Claims, No Drawings

FLAME RETARDANT BENZOCYCLOBUTENE RESIN WITH REDUCED BRITTLENESS

BACKGROUND OF THE INVENTION

1. Field of the Invention

The present invention pertains to benzocyclobutene resins, or more particularly to benzocyclobutene resins having flame retardant and reduced brittleness properties. Such resins have a high glass transition temperature (Tg>250° C.), low moisture absorption, low dielectric constant, good mechanical properties, flame retardancy, and can be cast onto a reinforcement to prepare a laminate for use as a substrate for electronic circuitry.

2. Description of the Related Art

In the manufacture of electronic devices, such as computers, printed circuit boards are widely used to support discrete electronic components and to provide the electrical circuitry between the components. Commercial electronic computers have become more powerful since their introduction, yet they have been reduced in physical dimensions from room size to desk size. As their size has decreased and the number of inter-connections due to more powerful logic has increased, the printed circuit boards used have become denser and more complex. Today's printed circuit boards can be extremely dense, with very small geometry and with many layers.

Printed circuit boards typically have a central core of a dielectric material, such as a composite of fiber glass and a thermosetting resin, for example an epoxy resin, which core has applied on at least one surface a layer of conductive material such as copper. The layer or layers of conductive material are etched or otherwise processed to provide circuits of a predetermined pattern. Individual circuit boards are then laminated to form a multilayer structure having the metal circuitry sandwiched between dielectric layers. A major problem exists in the preparation of printed circuit boards which are flame retardant and non-brittle.

It is known in the art to render thermoplastics fire resistant by adding flame-inhibiting substances to them when they are being prepared. However, such additives to thermoplastics produce side effects in addition to their flame-inhibiting action, which are undesirable because they impair the characteristic properties of the thermoplastics and limit their usefulness. Thus flame inhibiting substances are added in powder form to the thermoplastic and remain in powder form therein or, when they cool after being melted and mixed, separate again as an independent phase. These produce not only the desired flame-inhibiting effect, but also act as fillers which modify the mechanical properties of the thermoplastics, by embrittling them, and reducing their elongation and impact strength. U.S. Pat. No. 4,128,709, which is incorporated herein by reference, has proposed the mixture of certain polymers and copolymers of pentabromobenzyl esters and tetrabromoxylylene diesters to thermoplastics to render them flame retardant. However, such are not taught to be useful for thermosetting compositions. Many flame retardant compounds embrittle thermosetting plastics.

Benzocyclobutene polymers are known as thermosetting polymers having high thermal stability, but they are flammable. The invention reduces the flammability and brittleness of the benzocyclobutene (BCB) resins. These goals are achieved by adding a brominated acrylate, such as pentabromobenzylacrylate monomer (PBA) to the BCB and causing them to react to form a resulting fire-resistant thermoset material. The PBA also reduces the brittleness of the cured material versus pure, cured BCB by reducing the crosslinking density. An important difference between this invention and prior art is that addition of the PBA imparts fire resistance to a previously flammable BCB based material. There have been other reports of fire resistant materials containing BCB, but all those reported are cases where a fire resistant polymer had minor amounts of BCB as attached end groups. According to this invention, a material where the bulk is a flammable BCB-based resin has been rendered flame retardant by a reactive additive. The PBA, is unique in that it reacts with the BCB to create a homogeneous system. In addition, the PBA reduces the brittleness of cured BCB while imparting flame retardancy. The resin resulting from curing of PBA and BCB has a unique combination of high glass transition temperature (Tg>250° C.), low moisture absorption, low dielectric constant, good mechanical properties, flame retardancy (meeting or exceeding UL94 V-0 and/or VTM-0 requirements), and can be cast onto a reinforcement to prepare a printed circuit board. Other resins have been reported with high glass transition temperatures, but these typically absorb more moisture than the resin described herein or are not flame retardant or both.

SUMMARY OF THE INVENTION

The invention provides a flame resistant compound which comprises the reaction product of a) a halogen containing compound of the formulae

or

wherein R is a halogen containing aromatic group, a halogen containing aliphatic group or a combination thereof; $R_2$ is hydrogen, an aromatic group, an aliphatic group or a combination of an aromatic group and an aliphatic group which may contain halogen atoms; DA is a Diels-Alder reactive diene or a group that can act as a dienophile in a Diels-Alder reaction; and n is greater than or equal to 1; with b) a benzocyclobutene compound.

The invention also provides an article which comprises a substrate, and a flame resistant compound applied to the substrate; which flame resistant compound which comprises the reaction product of a) a halogen containing compound of the formulae

or

wherein R is a halogen containing aromatic group, a halogen containing aliphatic group or a combination thereof; $R_2$ is hydrogen, an aromatic group, an aliphatic group or a combination of an aromatic group and an aliphatic group which may contain halogen atoms; DA is a Diels-Alder reactive diene or a group that can act as a dienophile in a Diels-Alder reaction; and n is greater than or equal to 1; with b) a benzocyclobutene compound.

The invention further provides a process for preparing a laminate article which comprises i) forming a flame resistant compound which comprises the reaction product of a) a halogen containing compound of the formulae

or

wherein R is a halogen containing aromatic group, a halogen containing aliphatic group or a combination thereof; $R_2$ is hydrogen, an aromatic group, an aliphatic group or a combination of an aromatic group and an aliphatic group which may contain halogen atoms; DA is a Diels-Alder reactive diene or a group that can act as a dienophile in a Diels-Alder reaction; and n is greater than or equal to 1; with b) a benzocyclobutene compound;

ii) coating the flame resistant compound onto a substrate;

iii) heating the coated substrate at a sufficient pressure and at a sufficient temperature for a sufficient time to cure the flame resistant compound.

This invention fills the need for a resin that has a high glass transition temperature, low moisture absorption, low dielectric constant, good mechanical properties, flame retardancy, and can be cast onto a reinforcement to prepare a laminate for use as a substrate for electronic circuitry. Such can also be used for packaging materials.

DETAILED DESCRIPTION OF THE PREFERRED EMBODIMENT

The composition of the invention comprises a flame resistant compound which is the reaction product of a) a halogen containing compound of the formulae

or

wherein R is a halogen containing aromatic group, a halogen containing aliphatic group or a combination thereof; $R_2$ is hydrogen, an aromatic group, an aliphatic group or an combination of an aromatic group and an aliphatic group which may contain halogen atoms; DA is a Diels-Alder reactive diene or a group that can act as a dienophile in a Diels-Alder reaction; and n is greater than or equal to 1; with b) a benzocyclobutene compound.

In one preferred embodiment, DA is a dienophile which may be olefin, acetylene, maleimide, carbonyl, acrylate, alkyl acrylate and cyano containing groups. In another preferred embodiment, DA is benzocyclobutene, 1,3-butadiene, cyclopentadiene, styrene or furan. Particularly preferred halogen containing compounds are dienophiles having the formulae:

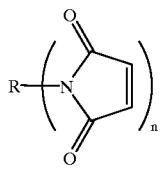 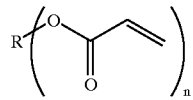

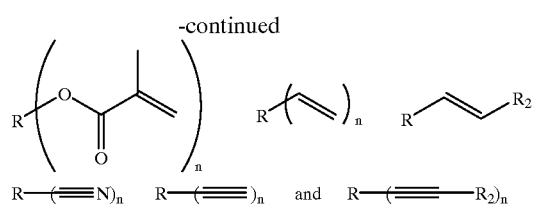

Alternatively the halogen containing compound can have the formulae:

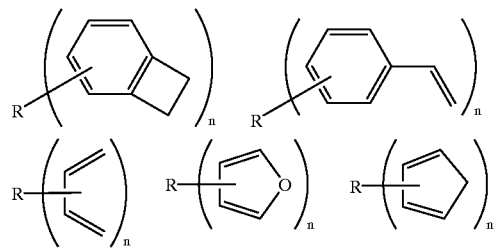

The most preferred the halogen containing compound has the formula:

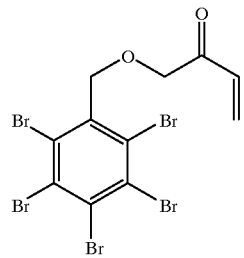

Such is commercially available from AmeriBrom, Inc. Other halogen containing compounds include these enumerated in U.S. Pat. No. 4,128,709, which is incorporated herein by reference.

In the preferred embodiment, the benzocyclobutene compound has the formula:

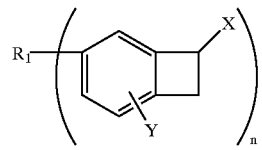

wherein

X is hydrogen, an aromatic group, an NHCO-alkyl group, OH or $NH_2$;

Y is hydrogen, a halogen, an aromatic group or an alkyl group;

$R_1$ is an aliphatic, aromatic, siloxane, titanate or a linking group; and n is greater than or equal to 1. Preferably $R_1$ has the formula

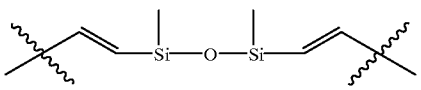

A preferred benzocyclobutene compound has the formula:

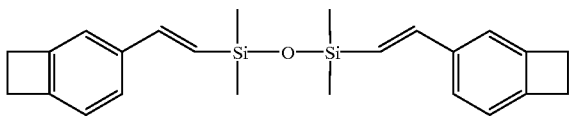

Such is commercially available as Cyclotene 3022 from the Dow Chemical Company.

The composition according to the invention is prepared by combining a benzocyclobutene (BCB) based monomer or partially reacted monomer, such as Dow's Cyclotene 3022 with pentabromobenzylacrylate monomer (PBA), such as that which is available from AmeriBrom, Inc., and causing them to react. The ratio of BCB to PBA preferably ranges from about 99:1 to about 60:40 to obtain a bromine content of from about 1% to about 30% by weight of resin. A more preferred ratio of BCB to PBA ranges from about 80:20 to about 60:40 to obtain a bromine content of from about 15% to about 30% by weight of resulting resin.

The resin composition according to the invention is prepared by dissolving the starting materials in a suitable solvent such as mesitylene(trimethylbenzene). Other suitable solvents can easily be determined by those skilled in the art. Preferably the PBA is dissolved in an amount of mesitylene equal to the weight of PBA and the solution brought to 70° C. to 85° C. This hot solution is then added to the BCB which is also in a solution of mesitylene and the materials are caused to react. Alternatively the PBA can be added to a mesitylene solution of BCB and dissolved under heating.

An article may then be prepared which comprises a substrate, and the flame resistant compound applied to the substrate. Suitable substrates non-exclusively a fibrous material, such as a woven or nonwoven fabric such as a nonwoven glass, a glass/organic fiber blend, or an organic fiber reinforcement, or a combination thereof. Suitable nonwoven fabrics include aromatic polyamide (aramid) fibers (e.g. "Kevlar" manufactured by Dupont, fineness: 1.5 denier, length: 7 mm). The solution is applied to the surface of a fabric, by any suitable means, such as brushing, dipping or spraying.

The resin solution, which typically has a solids content of from about 55% to about 70% is coated onto the fabric or diluted with mesitylene to from about 10 to about 30% solids and then coated onto the fabric. The coated fabric is then placed in an air filled oven to remove excess solvent. This may be done, for example, at from about 150° C. to about 175° C. for from about 2 to about 5 minutes. Optionally, a second coat of resin solution may be applied to increase the total amount of resin on the fabric. If a second coat is applied, the sample is dried again to remove excess solvent. After drying is completed, the samples are then heated at from about 175° C. to about 225° C. in a nitrogen purged oven for from 0 to about 20 minutes. The preferred heating time at about 190° C. to about 200° C. is about 3 to about 7 minutes.

The resin is then subjected to a curing. This is done by heating the coated substrate at a sufficient pressure and at a sufficient temperature for a sufficient time to cure the flame resistant compound. The laminate containing the partially cured resin is placed inside a nitrogen filled bag and pressed between metal plates. This procedure can alternatively be done under vacuum instead of in a nitrogen atmosphere. The initial temperature of the plates is typically from about 160° C. to about 170° C. After placing the coated fabric samples between the plates and increasing the pressure applied to the samples by the plates, the temperature of the plates is increased to from about 165° C. to about 240° C., preferably from about 220° C. to about 240° C. After the plate temperature reaches these elevated temperatures, the samples are pressed at from about 150 psi to about 700 psi for about 80 to about 100 minutes. The temperature of the plates and samples is then allowed to decrease to room temperature over the course of several hours. This may follow the natural cooling rate of the press plates, or a fan may be applied to cool the plates faster by circulating air past them.

The resultant thermosetting resin that has a high glass transition temperature (Tg greater than 270° C., preferably greater than or equal to 300° C.), low moisture absorption (0.3–0.35%), low dielectric constant (<3.0), good mechanical properties, flame retardancy (meeting or exceed UL94 V-O and/or VTM-O requirements), and can be used as a substrate for electronic circuitry. Such can also be used as packaging materials, in particular as packaging materials for electronic circuits. A characteristic of the thusly produced material is that it passes the Underwriters Laboratories flame retardancy tests UL-94 V-0 or VTM-0.

The following non-limiting examples serve to illustrate the invention.

EXAMPLE 1

Preparation of a thermoset resin containing 18.8 wt % bromine.

4.5 g of pentabromobenzylacrylate (PBA) (available from Ameribrom, and containing approximately 71 wt % bromine) was added to 20 g of 63 wt % Dow Cyclotene 3022 benzocyclobutene (BCB) in mesitylene. The mixture was heated in an oil bath at 80° C. until the PBA dissolved. The solution was poured into a Teflon lined pan and heated overnight at 170° C. under nitrogen to remove solvent. The resulting solid was heated at 230° C. for 2 hours to cure the material. The moisture absorption of the cured resin was 0.35% at 85° C./85% relative humidity. The material was observed to be flame retardant and appeared to meet the requirements for V-0 flame retardancy.

EXAMPLE 2

Preparation of a laminate with a thermoset resin containing 18.8 wt % bromine.

4.5 g of PBA (from Ameribrom, containing approximately 71 wt % bromine) was added to 20 g of 63 wt % Dow Cyclotene 3022 (BCB) in mesitylene. The mixture was heated in an oil bath at 80° C. until the PBA dissolved. This viscous solution was coated onto a woven fiber glass reinforcement and then heated in an oven at 170° C. for 3 minutes. Another layer of the BCB/PBA solution was coated onto the resulting laminate, and the laminate was dried again at 170° C. for 3 minutes. The laminate was then heated under nitrogen in an oven at 230° C. for 5 minutes. After this, the laminate was pressed at 250 psi in a press heated at 230° C. under nitrogen for two hours. (Alternatively, the pressing is done under vacuum). The glass transition temperature of the thermoset resin was 325° C. as determined by the peak of the tan_delta curve measured by differential mechanical analysis (DMA). The moisture absorption of the cured resin was 0.35% at 85° C./85% relative humidity. The laminate was observed to be flame retardant and appeared to meet the requirements for V-0 flame retardancy.

EXAMPLE 3

Preparation of a thermoset resin containing 25 wt % bromine.

6.3 g of PBA (from Ameribrom, containing approximately 71 wt % bromine) was dissolved in 6.3 g of mesitylene at 80° C. This solution was then added to 20 g of 63 wt % Dow Cyclotene 3022 (BCB) in mesitylene. The solution was poured into a Teflon lined pan and heated overnight at 170° C. under nitrogen to remove solvent. The resulting solid was heated at 230° C. for 2 hours to cure the material. The material was observed to be flame retardant and appeared to meet the requirements for V-0 flame retardancy.

EXAMPLE 4

Preparation of a laminate with a thermoset resin containing 25 wt % bromine.

6.3 g of PBA (from Ameribrom, containing approximately 71 wt % bromine) was dissolved in 6.3 g of mesitylene at 80° C. This solution was then added to 20 g of 63 wt % Dow Cyclotene 3022 (BCB) in mesitylene. This viscous solution was coated onto a woven fiber glass reinforcement and then heated in an oven at 170° C. for 3 minutes. Another layer of the BCB/PBA solution was coated onto the resulting laminate, and the laminate was dried again at 170° C. for 3 minutes. The laminate was then heated under nitrogen in an oven at 230° C. for 5 minutes. After this, the laminate was pressed at 250 psi in a press heated at 230° C. under nitrogen for two hours. (Alternatively, the pressing is done under vacuum). The glass transition temperature of the thermoset resin was 272° C. as determined by the peak of the tan_delta curve measured by differential mechanical analysis (DMA). The laminate was observed to be flame retardant and appeared to meet the requirements for V-0 flame retardancy.

EXAMPLE 5

(Comparative)

Comparative example with no Bromine added.

Dow Cyclotene 3022 (BCB) was coated onto a woven fiber glass reinforcement and then heated in an oven at 170° C. for 3 minutes. Another layer of the BCB solution was coated onto the resulting laminate, and the laminate was dried again at 170° C. for 3 minutes. The laminate was then heated under nitrogen in an oven at 230° C. for 5 minutes. After this, the laminate was pressed at 250 psi in a press heated at 230° C.–250° C. under nitrogen for two hours. (Alternatively, the pressing is done under vacuum). The glass transition temperature of the thermoset resin was >400° C. as determined by the peak of the tan_delta curve measured by differential mechanical analysis (DMA). The laminate was observed to be significantly less flame retardant than those prepared in Examples 1 through 4 and did not appear to pass the test for V-0 flame retardancy. The cured resin in this sample seemed to be significantly more brittle than the resins containing PBA.

EXAMPLE 6

Preparation of a flame-retardant laminate with a nonwoven reinforcement via wet coating.

A solution of BCB and PBA was first prepared as in Example 1. This solution was then diluted with additional mesitylene to obtain a solution with a solids content in the range of 25 wt %. This solution was coated onto a nonwoven glass and polymer fiber reinforcement and then heated in an oven at 170° C. for 3 minutes. The laminate was then heated under nitrogen in an oven at 200° C.–210° C. for 5 minutes. After this, the laminate was pressed at 600 psi in a press heated at 230° C. under nitrogen for two hours. The glass transition temperature of the thermoset resin was 325° C. as determined by the peak of the tan_delta curve measured by differential mechanical analysis (DMA). The moisture absorbed by the laminate at 85° C./85% relative humidity was dependent on the reinforcement, but usually was in the range of 0.4–1.0%. The laminate was observed to be flame retardant and appeared to meet the requirements for VTM-0 flame retardancy.

EXAMPLE 7

Preparation of a flame-retardant laminate with a nonwoven reinforcement via coating on copper.

A solution of BCB and PBA was first prepared as in Example 1. This solution was then coated onto copper foil and the solvent removed in an oven. Typical solvent removal conditions were 3 minutes at 170° C. followed by 5 minutes at 200° C. The original coating thickness was adjusted so that the dried resin thickness was 20 micrometers after removal of solvent. The reinforcement was then put between two pieces of this coated copper with the resin coated side facing the reinforcement. This stack was then pressed at 600 psi in a press heated at 230° C. under nitrogen for two hours. The glass transition temperature of the thermoset resin was >325° C. as determined by the peak of the tan_delta curve measured by differential mechanical analysis (DMA). The moisture absorbed by the laminate at 85° C./85% relative humidity was dependent on the reinforcement, but usually was in the range of 0.4–1.0%. Flame retardancy was not measured for this laminate, but is expected to be similar to that of the samples prepared in Example 5.

As can be seen from the above examples, the composition prepared according to the invention produces a laminate having significantly improved flame retardancy and less brittleness.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A flame resistant compound which comprises the reaction product of a) a halogen containing compound of the formulae

or

wherein R is a halogen containing aromatic group, a halogen containing aliphatic group or a combination thereof; $R_2$ is hydrogen, an aromatic group, an aliphatic group or a combination of an aromatic group and an aliphatic group which may contain halogen atoms; DA is a Diels-Alder reactive diene or a group that can act as a dienophile in a Diels-Alder reaction; and n is greater than or equal to 1; with b) a benzocyclobutene compound.

2. The flame resistant compound of claim 1 wherein DA is a dienophile selected from the group consisting of olefin, acetylene, maleimide, carbonyl, acrylate, alkyl acrylate and cyano containing groups.

3. The flame resistant compound of claim 1 wherein DA is selected from the group consisting of benzocyclobutene, 1,3-butadiene, cyclopentadiene, stryene and furan.

4. The flame resistant compound of claim 1 wherein the halogen containing compound is a dienophile selected from the group consisting of compounds having the formulae:

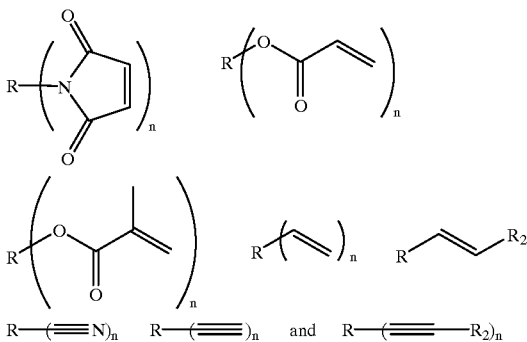

5. The flame resistant compound of claim 1 wherein the halogen containing compound is selected from the group consisting of compounds having the formulae:

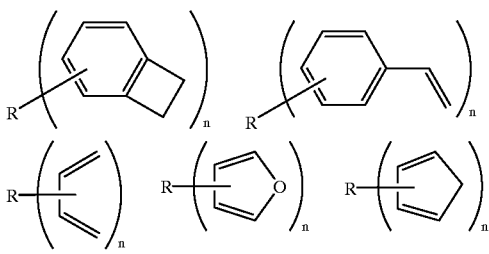

6. The flame resistant compound of claim 1 wherein the halogen containing compound comprises a compound of the formula:

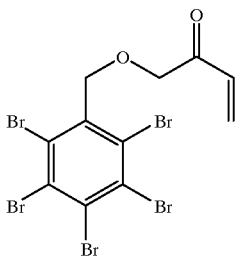

7. The flame resistant compound of claim 1 wherein the benzocyclobutene compound has the formula:

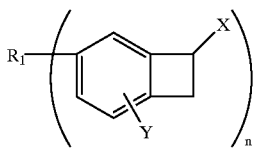

wherein
X is hydrogen, an aromatic group, an NHCO-alkyl group, OH or $NH_2$;
Y is hydrogen, a halogen, an aromatic group or an alkyl group;
$R_1$ is an aliphatic, aromatic, siloxane, titanate or a linking group;
n is greater than or equal to 1.

8. The flame resistant compound of claim 7 wherein $R_1$ has the formula

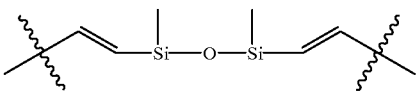

9. The flame resistant compound of claim 1 wherein the benzocyclobutene compound has the formula:

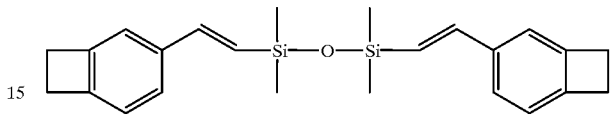

10. The flame resistant compound of claim 1 wherein the benzocyclobutene compound has the formula:

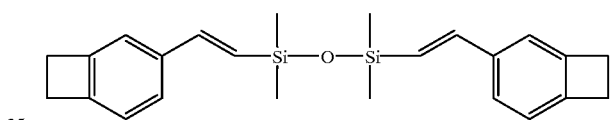

and the halogen containing compound comprises a compound of the formula:

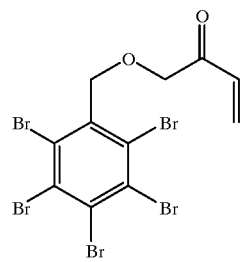

11. An article which comprises a substrate, and a flame resistant compound applied to the substrate; which flame resistant compound which comprises the reaction product of
   a) a halogen containing compound of the formulae

or

wherein R is a halogen containing aromatic group, a halogen containing aliphatic group or a combination thereof; $R_2$ is hydrogen, an aromatic group, an aliphatic group or a combination of an aromatic group and an aliphatic group which may contain halogen atoms; DA is a Diels-Alder reactive diene or a group that can act as a dienophile in a Diels-Alder reaction; and n is greater than or equal to 1; with
   b) a benzocyclobutene compound.

12. The article of claim 11 wherein the substrate comprises a fibrous material.

13. The article of claim 11 wherein the substrate comprises a woven or nonwoven fabric.

14. The article of claim 11 wherein the substrate comprises a glass fiber fabric, an organic fiber fabric or a combination thereof.

15. The article of claim 11 wherein the substrate comprises a fibrous material and the benzocyclobutene compound has the formula:

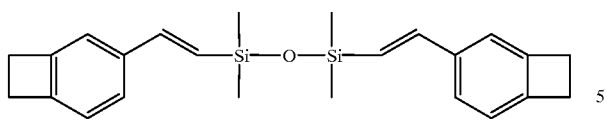

and the halogen containing compound comprises a compound of the formula:

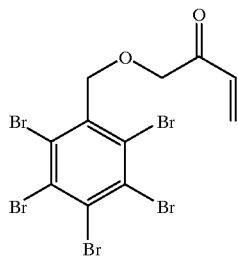

16. A process for preparing a laminate article which comprises
   i) forming a flame resistant compound which comprises the reaction product of
   a) a halogen containing compound of the formulae

or

wherein R is a halogen containing aromatic group, a halogen containing aliphatic group or a combination thereof; $R_2$ is hydrogen, an aromatic group, an aliphatic group or a combination of an aromatic group and an aliphatic group which may contain halogen atoms; DA is a Diels-Alder reactive diene or a group that can act as a dienophile in a Diels-Alder reaction; and n is greater than or equal to 1; with
   b) a benzocyclobutene compound;
   ii) coating the flame resistant compound onto a substrate;
   iii) heating the coated substrate at a sufficient pressure and at a sufficient temperature for a sufficient time to cure the flame resistant compound.

17. The process of claim 16 wherein the substrate comprises a fibrous material.

18. The process of claim 16 wherein the pressure ranges from about 150 psi to about 700 psi.

19. The process of claim 16 wherein the temperature ranges from about 165° C. to about 250° C.

20. The process of claim 16 wherein the substrate comprises a fibrous material and the benzocyclobutene compound has the formula:

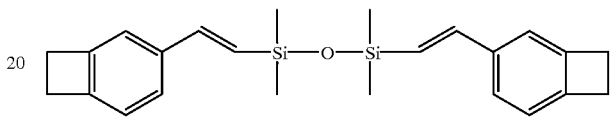

and the halogen containing compound comprises a compound of the formula:

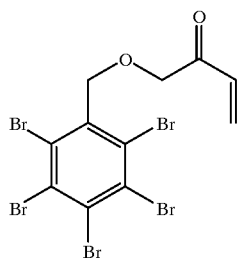

* * * * *